United States Patent [19]
Kaneoka et al.

[11] Patent Number: 5,659,174
[45] Date of Patent: Aug. 19, 1997

[54] SCANNING ELECTRON MICROSCOPE

[75] Inventors: Noriyuki Kaneoka; Kaneo Kageyama; Atushi Mouri; Junji Takada, all of Hitachinaka, Japan

[73] Assignee: Hitachi, Ltd., Tokyo, Japan

[21] Appl. No.: 628,816

[22] Filed: Apr. 5, 1996

[30]   Foreign Application Priority Data

Apr. 10, 1995 [JP] Japan .................................. 7-083963

[51] Int. Cl.$^6$ ..................................................... H01J 37/26
[52] U.S. Cl. ............................................. 250/310; 250/307
[58] Field of Search ..................................... 250/310, 307

[56]   References Cited

U.S. PATENT DOCUMENTS 5,254,857  10/1993  Ross et al. .............................. 250/310
5,359,197  10/1994  Komatsu et al. ....................... 250/310

*Primary Examiner*—Jack I. Berman
*Attorney, Agent, or Firm*—Antonelli, Terry, Stout & Kraus, LLP

[57]   ABSTRACT

A sample is scanned with a focused electron beam so that secondary particles characteristic of the sample are generated therefrom and the generated particles are detected by a detector so as to be converted into an electric signal. The electric signal is converted into digital image data, which are stored in a image memory. The stored image data are displayed on a display along with digital SEM operating picture data stored in a memory of a personal computer. An operating signal generated by an input device is conducted to not only the personal computer but also an input control unit, which converts the operating signal into a control signal. This control signal is used to change a parameter associated with the image data, i.e., for example, to control focusing of the electron beam.

9 Claims, 7 Drawing Sheets

SCANNING ELECTRON MICROSCOPE

BACKGROUND OF THE INVENTION

The present invention relates to a scanning electron microscope for observing a very small area of a sample, and more particularly to a scanning electron microscope which has a computer, such as a personal computer or a workstation, as a constituent element and which can be operated using its window system.

Electron microscopes are used for observing very fine structures of samples in various research and development fields. In general, evaluation of a sample using an electron microscope is performed by observing a SEM (scanning electron microscope) image on a display screen. However, as high performance personal computers and workstations are being reduced in price and are being widely used, a technology has been used in recent years, wherein SEM images are stored as a file of image data and the stored SEM images are evaluated with image processing, such as a filtering process, using a personal computer or workstation. An example of a system which provides storing and retrieving of SEM images is disclosed in Japanese Patent Application Laid-Open No. 1-8485 (1989) titled "Image retrieving and analyzing workstation". Further, there has been developed an electron microscope in which a personal computer or a workstation is used as a constituent element of the electron microscope to adjust its focus from an operating picture using a window system. The window system of a personal computer constitutes system software for providing and managing a standard window and parts, such as buttons. This system makes development of application software easier and provides an operator with a common operational environment. Therefore, the window system is becoming widely used.

FIG. 2 shows an example of a conventional construction of an electron microscope which has a personal computer as a constituent element.

An electron beam 7 emitted from an electron gun 1 is accelerated by an acceleration voltage, which can be variably set, and is focused on a sample 5 disposed on a sample stage 6 by a focusing electron lens system of an irradiation system 2, which is operated under control of an irradiation system controller 9. The focusing lens system may comprise a single focusing electron lens or a plurality of focusing electron lenses. The irradiation system 2 further includes alignment coils, which serve to correct the deviation of the axis of the electron beam from a correct axis thereof, and stigmater coils, which serve to correct astigmatism of the electron beam, the alignment coils and the stigmater coils being operated under control of the irradiation system controller 9. The electron beam is further deflected two-dimensionally by deflection coils of a deflection system 3, which are operated under control of a deflection system controller 10, and consequently the sample 5 is two-dimensionally scanned with the focused electron beam. The deflection system 3 further includes image shift coils, which are operated under control of the deflection system controller 10, so as to select a field of view of the sample 5, i.e., a position of irradiation of the sample 5 with the electron beam 7.

Scanning of the sample 5 with the beam 7 generates secondary particles 8, such as reflected electrons, secondary electrons and so on, i.e., particles characteristic of the sample 5, depending on the shape and the material of the sample 5. The secondary particles 8 are detected and amplified by a detector device 4, which includes a secondary particle detector and a bias and gain controller thereof, and then the signal is converted into a digital signal by an A/D converter 11 and stored in an image memory 13. An address control circuit 12 generates an address of the image memory 13 in synchronism with a scanning signal of the electron beam. The address control circuit 13 also operates to read out an SEM image stored in the image memory 13 with a television scanning speed and the signal is D/A converted by a D/A converter 20 to form a video signal. The video signal is displayed on a display 15 of the personal computer in real-time by being processed with a super-imposing circuit of an image composing means 17.

Displayed on the display 15 of the personal computer 16 is an operating picture for adjusting the focus and so on using the window system of the personal computer 16, which is controlled by operating an input means, such as a key board 18, a mouse 19, a track ball or the like. Control command communication is performed between the personal computer 16 and an SEM control unit 14 and transmission of image data is performed between the personal computer 16 and the image memory 13. A standard interface for personal computers, such as RS-23C, SCSI (Small Computer System Interface) or the like, is often used for connecting these units.

There are some cases where an X-ray analyzer, such as an energy dispersive X-ray spectrometer (EDX), is connected to a scanning electron microscope to perform material analysis of a sample using an X-ray generated when the sample is irradiated with the electron beam. A personal computer or a workstation is also used in the X-ray analyzer to display control items of the X-ray analyzer or an analyzed result. Therefore, in a case of a scanning electron microscope combined with an X-ray analyzer controlled by a personal computer, there are provided two personal computers.

The SEM control means 14 serves to change parameters associated with the image of the sample 5 on the basis of received control signals or commands into which the computer 16 converts operating signals input by manipulating the input means. Such parameters are a focal length of the focusing electron lens system, which can be changed for focusing control by adjusting currents flowing through lens coils of the focusing electron lens system, astigmatism of the electron beam, which can be changed for astigmatism correction by adjusting currents flowing through the stigmater coils, a deviation of the axis of the electron beam from a correct axis thereof, which can be changed for making both the axes coincident with each other, i.e., axis alignment by adjusting currents flowing through the alignment coils, brightness and contrast of the image, which can be changed by adjusting the bias and gain of the detector device with the bias and gain controller, acceleration voltages, scan rates, which can be changed by changing currents flowing in the deflection coils, an amount of movement of a field of view of the sample 5, which can be changed for selecting the field of view by changing currents flowing through the image shift coils or moving the sample stage, an emission current which may be changed, and so on. The starting/stopping of scanning, starting to take a photograph, the setting of the sensitivity of a photographic film, the measuring of a length between arbitrary positions on the image are also performed under control of the SEM control means 14 on the basis of the control signals into which the computer 16 converts the operating signals input by manipulating the input means.

The prior art described above is disadvantageous in that the response time cannot provide a pleasant operating condition because processing for the window system and the communication control from operation of the input means, such as a mouse, to execution of control of the hardware takes a long time period.

A case where the focus is adjusted by controlling the focusing electron lens system while observing an SEM image will be described below as an example. On the display 15 of the personal computer 16 shown in FIG. 2, a slider (scroll bar) for adjusting focus is displayed through the window system, and adjustment of the focus is executed by dragging the knob of the slider through a mouse operation (an operation of moving the mouse while pushing the button). The OS (Operating System) generates an event in the window system of the personal computer 16 by the movement of the mouse 19. With the event, the window system executes processing to move the knob on the display 15 and issuance of an event to an application program. An SEM control program of the application program judges the event as adjustment of focus and issues a control command to the SEM control unit 14. The control command involves an alignment of data in a format appointed between the personal computer and the SEM control unit, and processing is required for conversion of the format. Further, the SEM control unit 14 decodes the received command to recognize the command as a request for control of the electron lens system 2, and changes the setting of the irradiation system controller 9 of the hardware. As the focus value, i.e., focal length, of the focusing electron lens system is changed, an SEM image according to the changed focus can be obtained. The processing time to this point becomes several hundred seconds, and the response is not fast enough to repeat the above processing until an image having an optimal focus is obtained, and accordingly a pleasant operating condition cannot be obtained.

Further, in order to execute image processing, such as filtering, of image data using a personal computer, it is required to transmit the image data from the image memory 13 to the memory in the personal computer 16. The transmission speed of the image data is approximately 1 megabyte/second in effective speed when on SCSI interface is used. The time for transmitting image data of 4 mega bytes having vertical and horizontal resolutions of 2000 dots each and tones of 8 bits becomes approximately 4 seconds. However, it is typical for an operator to complain about his operating environment when the processing time from the start of an operation of data transmission to completion of the processing exceeds 1 second.

Where an X-ray analyzer is connected to a scanning electron microscope, a personal computer or a workstation is used for controlling the X-ray analyzer and displaying its analyzed result. Therefore, two personal computers are provided including the personal computer for the scanning electron microscope. Two input/output units are also provided. Accordingly, the operator cannot avoid the need to operate two sets of input means, which results in an environment difficult to operate in.

SUMMARY OF THE INVENTION

An object of the present invention is to provide a scanning electron microscope which is suitable for pleasant and efficient operation.

According to the present invention, a scanning electron microscope is provided which comprises means for emitting an electron beam; means for focusing the electron beam on a sample; means for scanning the focused electron beam so as to produce an information signal characteristic of the sample; means for producing digital image data on the basis of the information signal; means for storing the digital image data; means for storing digital SEM operating picture data; a computer; means connected operatively to the computer for displaying an image of a sample, on the basis of digital image data stored in the digital image data storing means with SEM operating picture data stored in the digital SEM operating picture data storing means, on the image displaying means; means for producing an operating signal so as to apply the same to the computer; means connected operatively to the operating signal producing means for producing a control signal on the basis of a received operating signal without passing the same through the computer; and means for changing a parameter associated with the image on the basis of the control signal.

Other objects and features of the present invention will become apparent from the descriptions of preferred embodiments of the present invention taken in connection with the accompanying drawings.

DESCRIPTION OF THE PREFERRED EMBODIMENTS

The present invention will be described in detail below, referring to embodiments.

Figure 1:
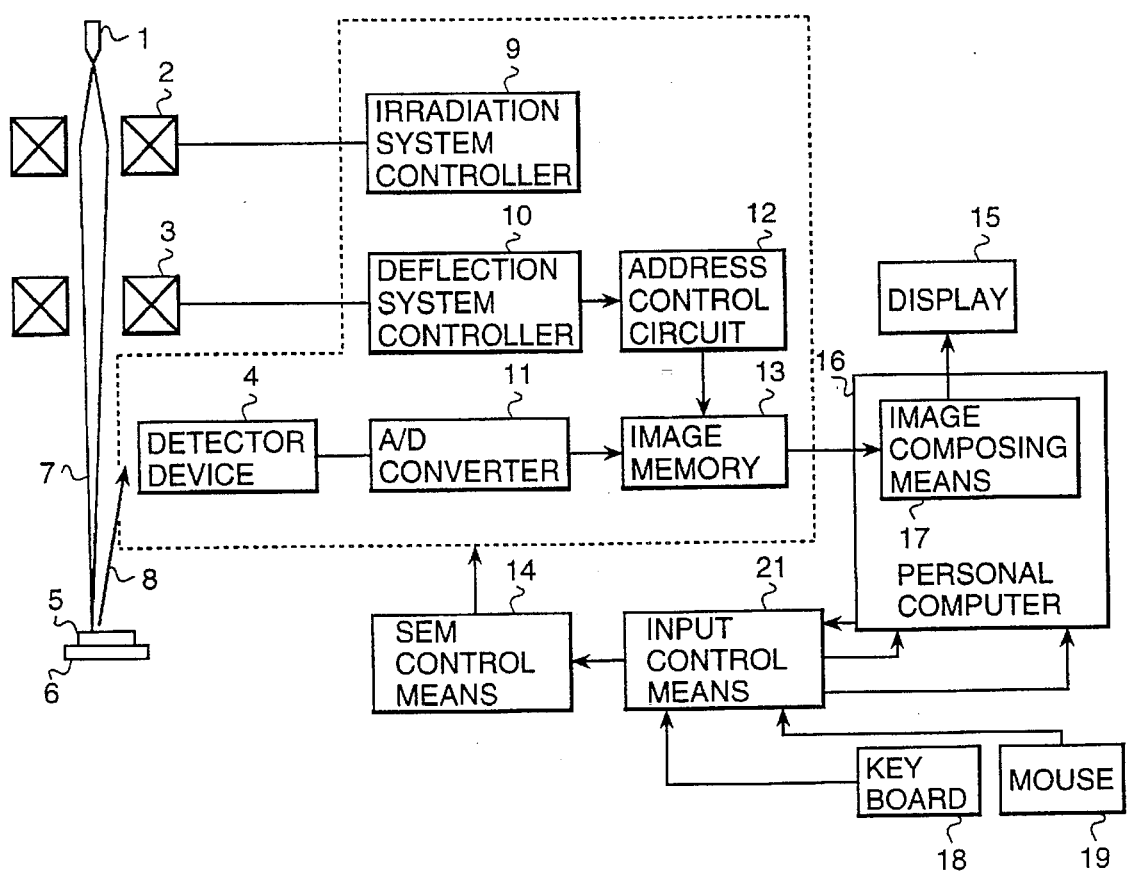
FIG. 1 is a block diagram of an embodiment of a scanning electron microscope in accordance with the present invention.
Figure 2:
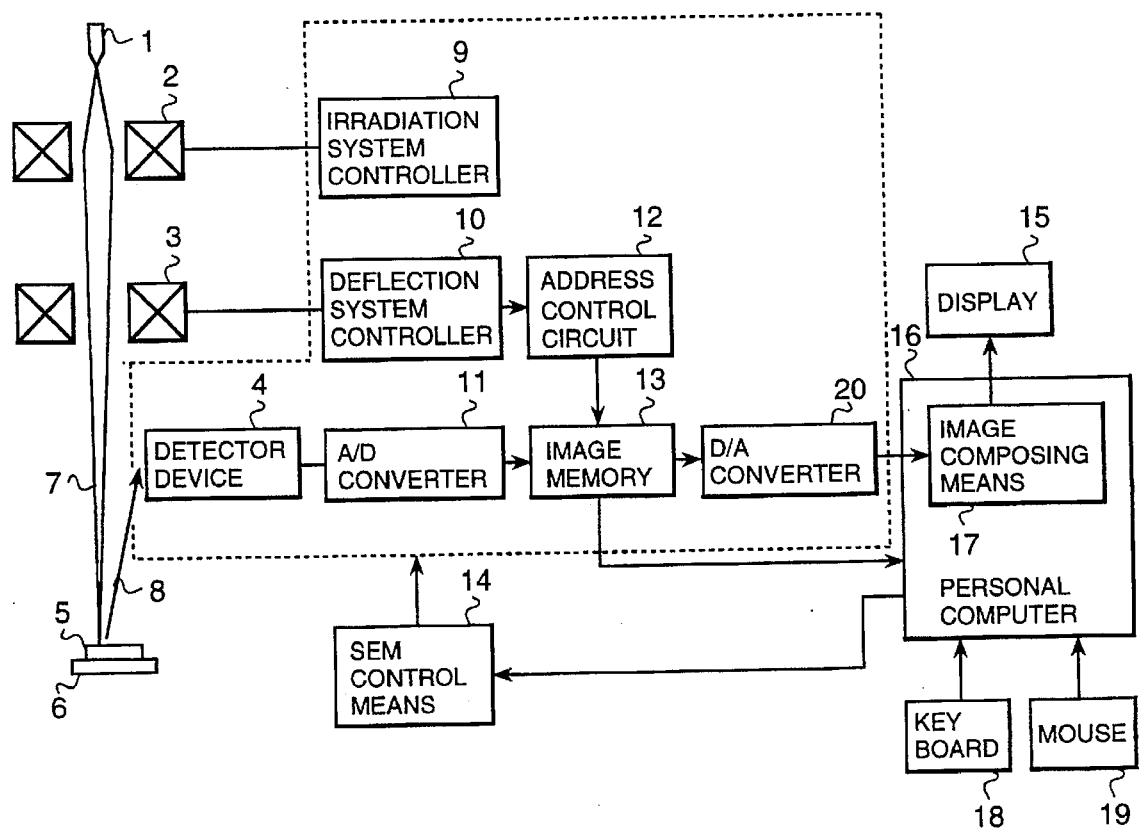
FIG. 2 is a block diagram of an example of a conventional scanning electron microscope.

FIG. 1 is a block diagram of an embodiment of a scanning electron microscope in accordance with the present invention.

An electron beam 7 emitted from an electron gun 1 is accelerated by an acceleration voltage, which can be variably set, and is focused on a sample 5 disposed on a sample stage 6 by a focusing electron lens system of an irradiation system 2, which is operated under control of an irradiation system controller 9. The focusing electron lens system may comprise a single focusing electron lens or a plurality of focusing electron lenses. The irradiation system 2 further includes alignment coils, which serve to correct the deviation of the axis of the electron beam from a correct axis thereof, and stigmater coils, which serve to correct astigmatism of the electron beam, the alignment coils and the stigmater coils being operated under control of the irradiation system controller 9. The electron beam 7 is further deflected two-dimensionally by deflection coils of a deflection system 3, which are operated under control of a deflection system controller 10, and consequently the sample 5 is two-dimensionally scanned with the focused electron beam. The deflection system 3 further includes image shift coils, which are operated under control of the deflection system controller 10 so as to select of a field of view of the sample 5, i.e., a position of irradiation of the sample 5 with the electron beam 7.

Scanning of the sample 5 with the electron beam 7 generates secondary particles 8, such as reflected electrons, secondary electrons and so on, i.e., particles characteristic of the sample 5, depending on the shape and the material of the sample 5. The secondary particles 8 are detected and amplified by a detector device 4, which includes a secondary particle detector and a bias and gain controller thereof, and then the signal is converted into a digital signal by an A/D converter 11 and stored in a image memory 13. At this time, an address control circuit 12 generates an address for the image memory 13 in synchronism with a scanning signal of the electron beam. The address control circuit 12 also reads out an SEM image stored in the image memory 13 with a television scanning speed and the stored image data of the SEM image are transmitted to an image composing means 17 as occasion demands. The image composing means 17 composes or combines picture in a data stored in a display memory of a personal computer 16 and the SEM image data and the combined image data are displayed on a display 15 of the personal computer 16 in real-time.

Figure 3:
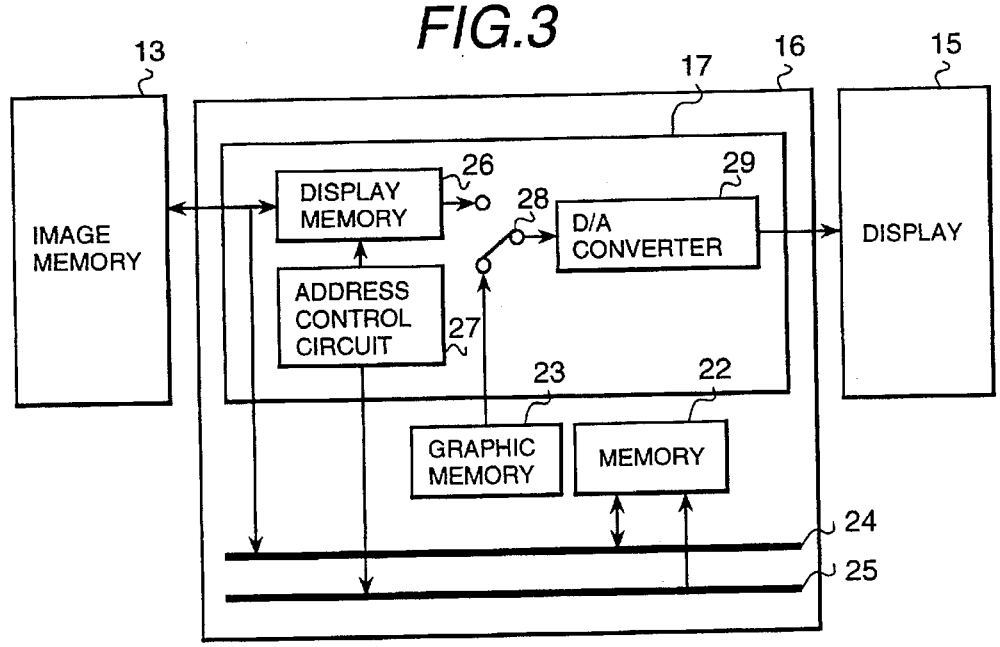
FIG. 3 is a block diagram of an image composing means shown in FIG. 1.

FIG. 3 is a block diagram of the image composing means 17, which is composed of a display memory 26, an address control circuit 27, a switch 28 and a D/A converter 29. The display memory 26 is a two port memory having a size corresponding to the resolution of the SEM image to be displayed on the display 15, and performs updating and writing of the image memory 13 and reading with a display speed of the display 15. The switch 28 switches image data of a graphic memory 23 of the personal computer 16 and image data of the display memory 26 at a high speed to input data to the D/A converter 29. The graphic memory 23 stores operating picture data formed by a window system of the personal computer 16, and an area for displaying the SEM image in real-time is reserved. The switch 28 usually selects the side of the graphic memory 23 and switches to the side of the display memory 26 at the display timing of the SEM image display area. Image data is transmitted to a memory 22 of the personal computer 16 through a data bus 24 of the computer 16 and the address control circuit 27 performs control of DMA (Direct Memory Access) transmission through an address bus 25 of the computer 16. The transmission speed is nearly 8 mega-bytes/second when a standard personal computer bus of ISA (Industry Standard Architecture) is used, and accordingly image data having 4 mega-bytes can be transmitted in 0.5 second.

Figure 4:
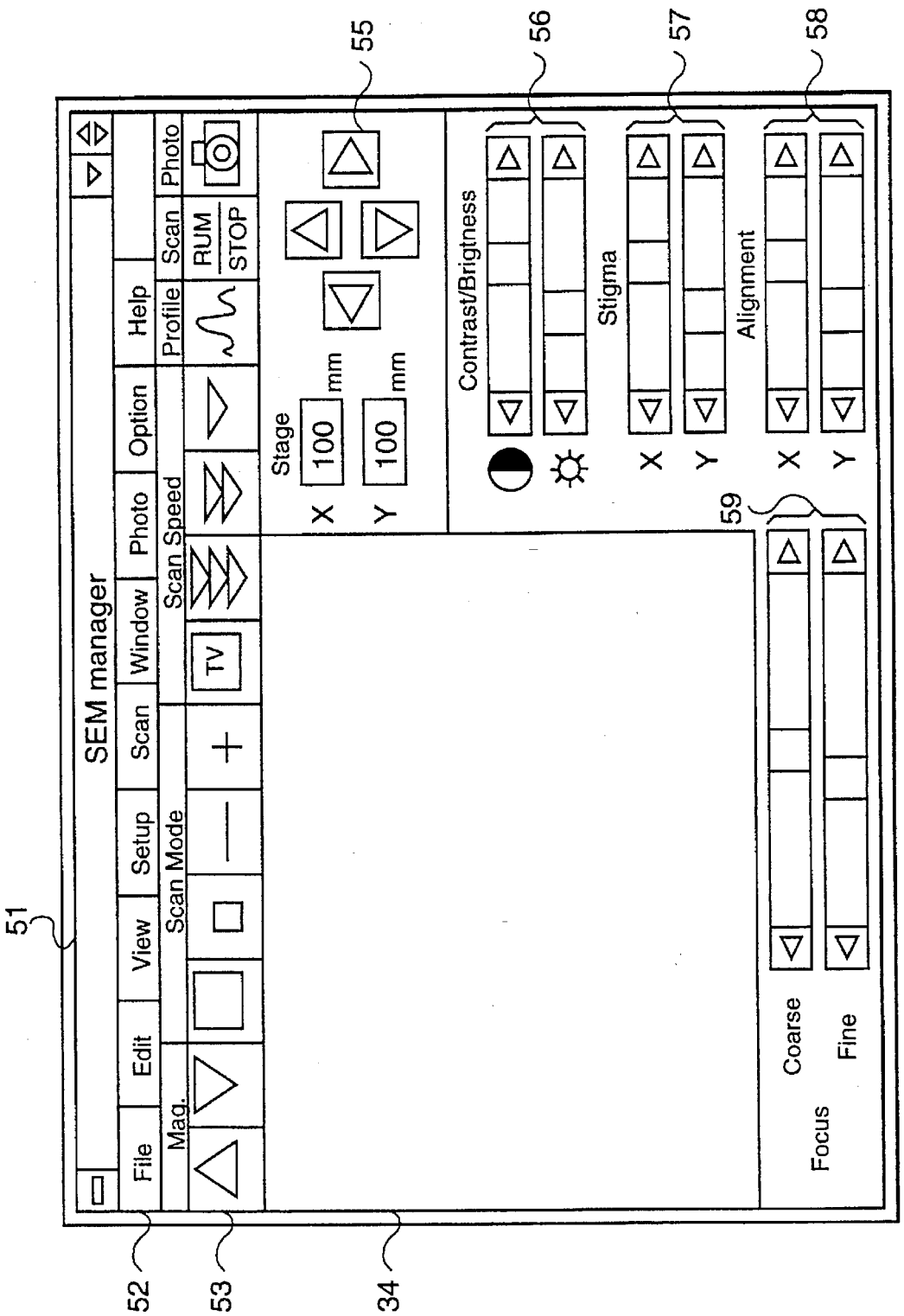
FIG. 4 is a diagram showing an example of an operating picture on a display shown in FIG. 1.

FIG. 4 is a view showing an example of an operating picture stored in the graphic memory 23. There is displayed a menu bar 52 under a title bar 51. The menu button "File" in the menu bar is a menu button for setting a file to store a displayed SEM image or for opening a file having stored a SEM image. The menu button "Edit" is a button for returning to an executed operation or for a cut-and-paste operation in which a part of an image is cut and pasted to another portion. The menu button "View" is a button for changing magnification or changing a window size displaying a SEM image. The menu button "Setup" is a button for operation of setting an acceleration voltage applied to the electron gun or an emission current emitted from the electron gun. The menu button "Scan" is a button for starting/stopping of scanning or for setting a scanning speed. The menu button "Window" is a button for arranging windows when a plurality of windows are displayed or for opening and closing the operating windows. The menu button "Photo" is a button for starting the taking of a photograph or for setting film sensitivity. The menu button "Option" is a button for performing a length measurement function to measure a length between arbitrary positions on an image. The menu button "Help" is a button for displaying an explanation of the various operating methods. As one of the menu buttons is clicked using the mouse, the corresponding sub-menu is opened. For instance, when the menu button "File" is clicked, sub-menu "Open", "Close" and so on are opened.

Under the menu bar 52 there is displayed a tool bar 53 in which buttons for frequently used menus among the menu buttons are arranged in order to execute processing by one-touch without opening the menu. From the left side of the figure, magnification buttons for increasing and decreasing the magnification, scan mode buttons for setting the scanning range to normal, area, line or spot mode, scan speed buttons for selecting a scan speed, a line profile button, a scan run/stop button, and a photograph button are displayed.

Under the tool bar 53 there is provided an SEM image display window 34, and in a position of the right hand side there is provided a stage control window 55 for controlling X Y positions of a stage on which the sample 5 is disposed. Further, in positions of the right hand side and the lower side of the SEM image display window 34 there are displayed operating pictures, such as contrast/brightness adjusting sliders 56 for adjusting contrast and brightness of an image, an astigmatism correction slider 57 for correcting astigmatism of the electron beam, an alignment adjusting slider 58 for compensating for the deviation of the axis of the electron beam from a correct axis thereof, and a focus adjusting slider 59.

Figure 5:
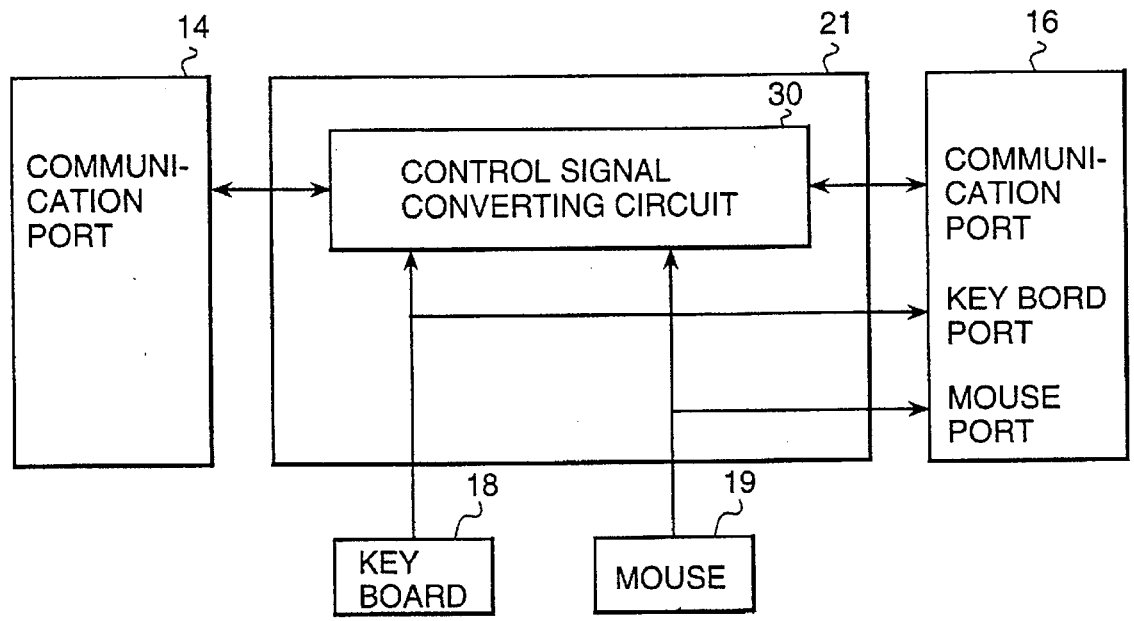
FIG. 5 is a block diagram of an input control means shown in FIG. 1.

FIG. 5 is a block diagram of the input control means 21 which includes a control signal converting means 30 constituted by a one-chip microcomputer. The personal computer 16 and the SEM control means 14 are controlled through communication thereto of specified control commands. In general, the input control means 21 directly transmits an operating signal of the input means, such as the key board 18 or the mouse 19, to the personal computer 16. The personal computer 16 generates a control command based on the operating signal of the input means, and the control signal converting circuit 30 directly transmits the control command to the SEM control means 14. Control using the operating picture and calculating units of the personal computer 16 is performed as described above. Processing requiring not so high a speed of response, for example, the operation of setting a magnification, setting a scan mode, setting a scan speed, photographing and so on, is executed with a processing route passing through the personal computer.

Of the parameters associated with the image of the sample 5, those determining the quality of the image are the focal length of the focusing control electron lens system, which can be changed for focusing control by adjusting the currents flowing through the focusing electron lens system, astigmatism of the electron beam, which can be changed for correction control by adjusting currents flowing through the stigmater coils, a deviation of the axis of the electron beam from a correct axis thereof which can be changed to make the both axes coincident with each other, i.e., axis alignment by adjusting the currents flowing through the alignment coils, brightness and contrast of the image, which can be changed by the bias and gain of the detector device with the bias and gain controller, and so on.

The input/output control means 21 transmits the operating signal of the input means to the computer 16 and at the same time converts the operating signal of the input means into a control command using the control signal converting circuit 30 so as to conduct the control command to the SEM control unit 14. Therefore, the control command for processing requiring a high speed of response, such as the focusing of an SEM image or adjusting of stigma, is directly input to the SEM control unit 14 by by-passing the processing of the personal computer 16, and consequently the response time from the operation of the input means to the controlling of the hardware can be shortened. Which processing the control command is used for is generated by the personal computer and which processing the control command is used for is generated by the control signal converting circuit 30 of the input/output control means 21 are determined in advance and are stored in the memory of the personal computer 16.

Figure 6:
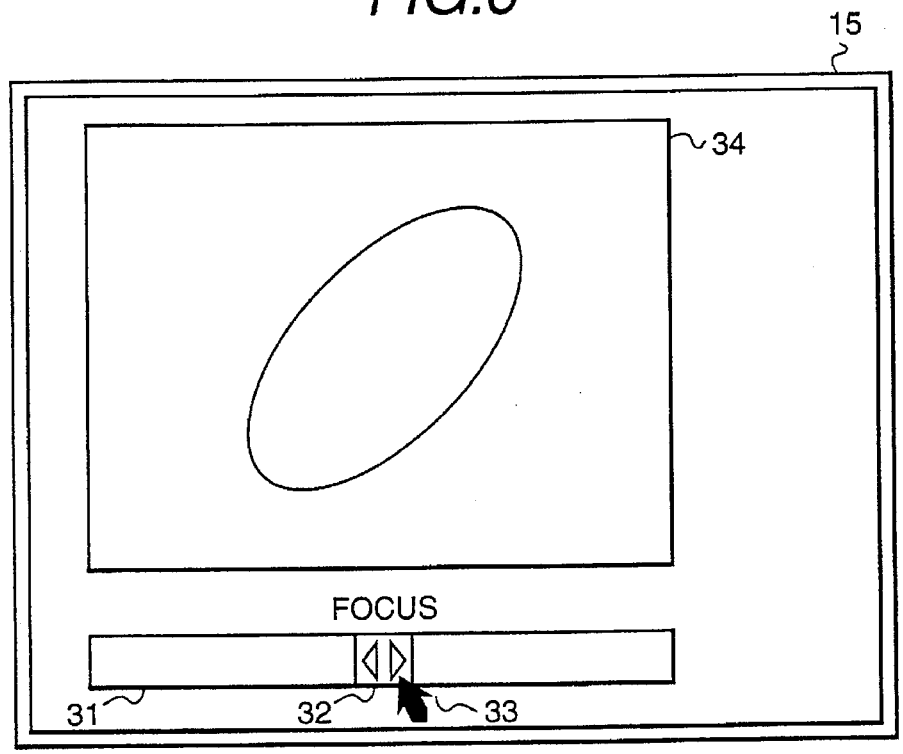
FIG. 6 is a diagram showing an example of a composite image of an operating picture and a SEM image on a display shown in FIG. 1.

FIG. 6 is a view showing an example of an operating picture produced on the display 15. The figure shows a composite screen image of an operating image and an SEM image composed or combined by the image composing means 17 using a standard window system of the personal computer. In FIG. 6, a slider 31 and a knob 32 for adjusting focus are shown as an example of the operating screen images. However, as shown in FIG. 4, actually, the other operating screen images are also displayed. A case where an operator adjusts focus by dragging the knob 32 of the slider 31 while observing the SEM image 34 on the display 15 will be described below, referring to FIG. 6.

With operation of the mouse 19, operating signals corresponding to the operation are sequentially output from the mouse 19. The input control means 21 transmits the operating signals to the personal computer 16, and the personal computer 16 performs processing to move a mouse cursor 33. The mouse cursor 33 is moved to the position of the knob 32 of the slider 31, which is a state where dragging can be performed by pushing a button of the mouse 19. The operating system of the personal computer 16 detects that the mouse cursor 33 is on the knob 32 as the button of the mouse 19 is pushed, and then generates an event to the window system of the personal computer.

With this event, the window system moves the knob 32 and issues an event to an SEM control program of an application program. The SEM control program judges that the event is for adjusting focus, and recognizes that a control command should be generated by the control signal converting circuit 30 of the input control means 21, and then instructs the input control means 21 so that the operating signal of the mouse 19 is converted to an input to the SEM control means 14. As the mouse 19 is moved while the button of the mouse 19 is being pushed, operating signals to indicate the movement are successively output from the mouse 19. The input control means 21 transmits the signals representing the movement to the personal computer 16, and, at the same time, also inputs the control command of the converted moving signals of the mouse 19 to the SEM control means 14.

The window system of the personal computer 16 moves the position of the knob 33 on the slider 32 corresponding to the moving signal of the mouse 19. On the other hand, the SEM control means 14 receives the generated control command corresponding to the moving signal of the mouse 19 from the control signal converting circuit 30, and inputs an instruction signal for control of the focus point of the lens to the irradiation system controller 9 for driving the focusing electron lens system.

The operator operates the mouse 19 until an optimum focus is obtained while he is observing the SEM image 34 displayed on the display 15. When an optimum focus is obtained, he releases the button of the mouse 19. The operating system of the personal computer 16 detects the release of the button of the mouse 19, and generates an event to the window system of the personal computer. The window system issues the event to the SEM control program of the application program. The SEM control program judges that the event is for completion of the adjusting of the focus, and instructs the input control means to stop converting the signal of the mouse 19 to input the control command to the SEM control means. As described above, since the input control means 21 inputs the operating signal from the input means 18, 19 into the SEM control means 14 while by-passing the personal computer 16, the processing time of the personal computer is eliminated and the response time from the operation of the input means to the hardware control is shortened, which can improve the operability.

Figure 7:
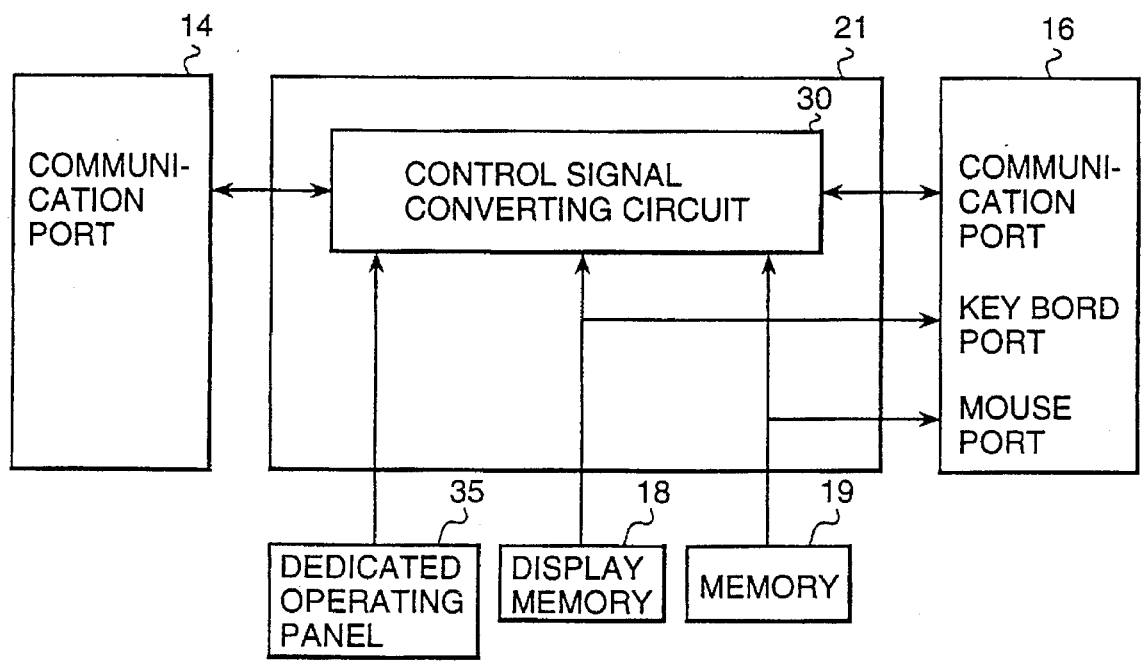
FIG. 7 is a block diagram of another embodiment of input control means shown in FIG. 1.

FIG. 7 is a block diagram of another embodiment of an input control means 21 in accordance with the present invention. In addition to the key board 18 and the mouse 19, the input control means has an input port for a dedicated operating panel 35 of the scanning electron microscope, and is composed of a control signal converting means 30 and a path for control signals. The dedicated operating panel 35 is composed of a plurality of switches and a rotary encoder, and operating signals are output by operation of the switches and the rotary encoder. Although a general-purpose input means for a personal computer, such as a mouse and a track ball, are suitable for controlling the position of a mouse cursor, they are not always suitable for fine adjustment, such as focus adjusting. By provision of a dedicated operating panel 35, as in the present embodiment, fine adjustment and both-hands operation can be realized.

The control signal converting circuit 30 of the input control means 21 converts an operating signal of the dedicated operating panel 35 to input a control command into the SEM control means 14. Further, at the same time, the control command is input to the personal computer 16. As the SEM control program of the personal computer 16 receives the control command, the SEM control program moves the position of the knob of the slider on the operating picture image in the same manner as the operation of the mouse. As described above, by connecting the dedicated operating panel, operability can be improved. In this case, there is no need to prohibit the operation using the mouse or the like. That is, the input control means can be constructed so that operating control items, such as focusing, for which switches or knobs are also provided on the dedicated operating panel, can be operated both from the dedicated operating panel 35 and from the other input means 18, 19.

Figure 8:
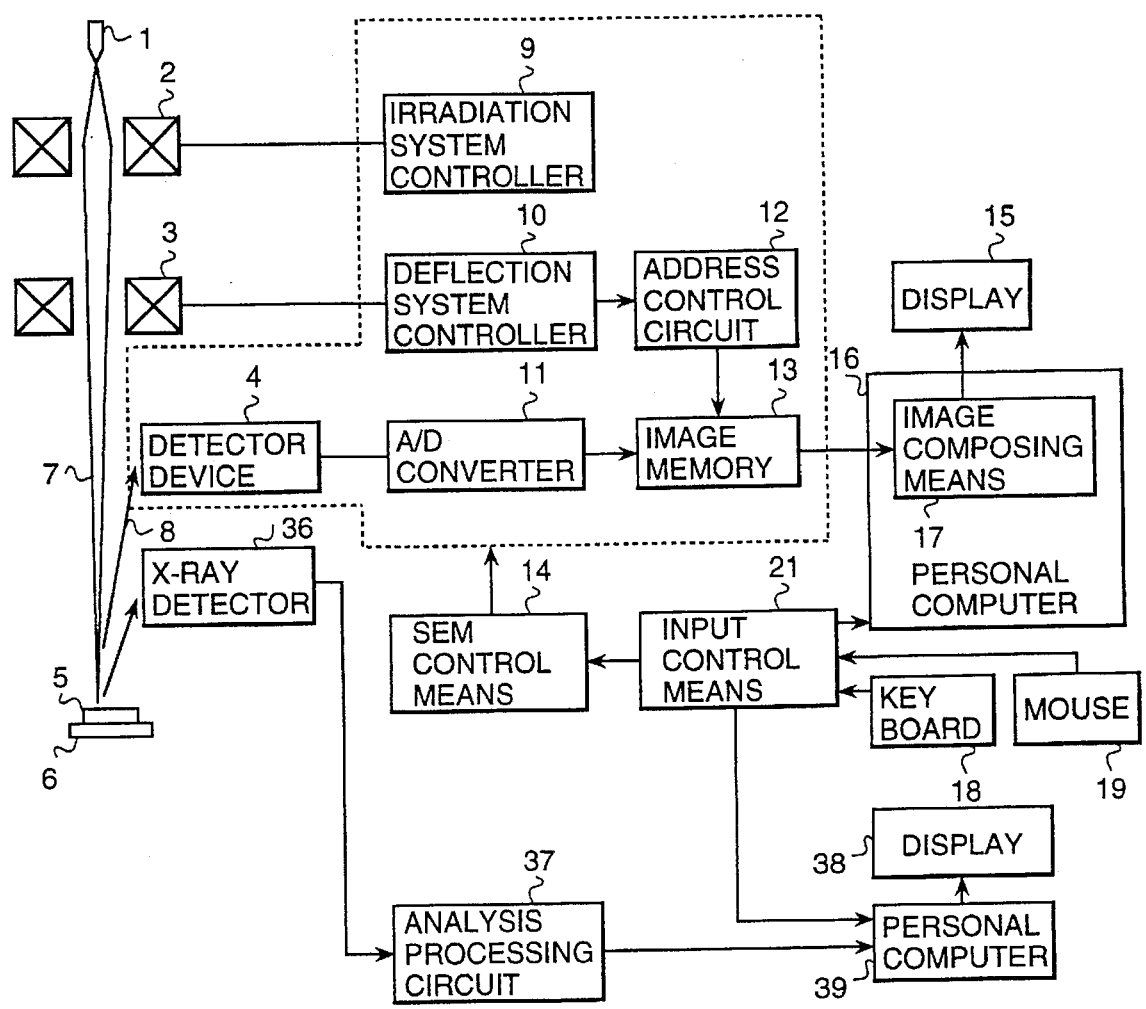
FIG. 8 is a block diagram of yet another embodiment of a scanning electron microscope in accordance with the present inventions.

Yet another embodiment, in which the present invention is applied to a system for combining a scanning electron microscope and an X-ray analyzer, will be described in connection with FIG. 8.

In this embodiment, a detector 36 for X-ray, an analysis processing circuit 37, an additional personal computer 39 and an additional display 38 for X-ray analysis control are added to the construction of the first embodiment. Input means, such as a key board 18 and a mouse 19 and the like, are of one set, and the input control means 21 distributes an operating signal of the input means to the two personal computers 16, 39 and the SEM control means 14.

Figure 9:
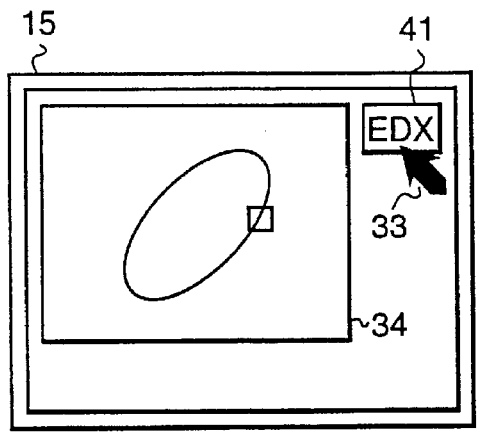
FIG. 9(A), FIG. 9(B), FIG. 9(C) and FIG. 9(D) are diagrams showing examples of operating pictures on two displays shown in FIG. 7.
Figure 9:
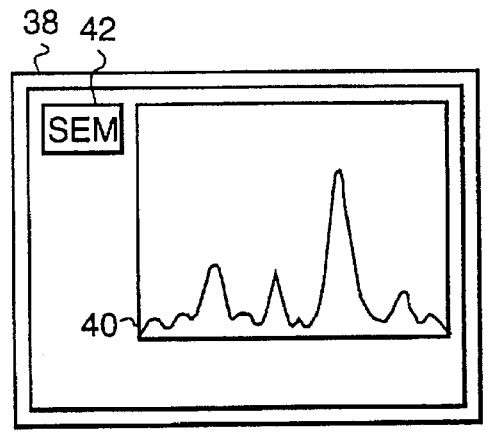
Figure 9:
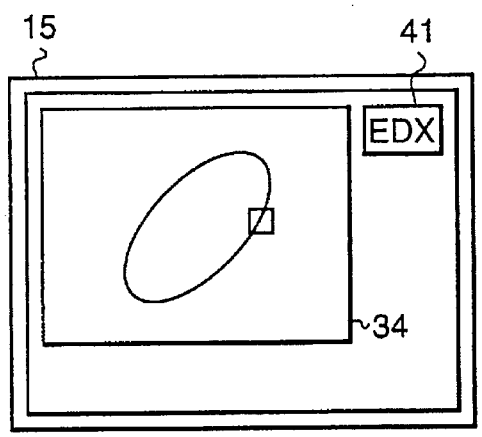
Figure 9:
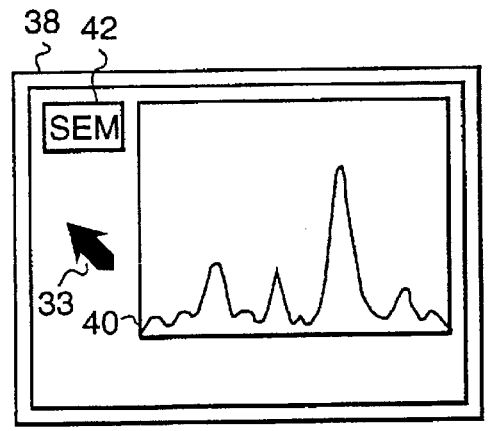

FIG. 9 shows examples of operating pictures produced on the display 15 of the personal computer 16 for SEM control and on the display 43 of the personal computer 44 for X-ray analysis control. On the display 15 for SEM control, there are displayed a menu bar, a tool bar, a stage control window, sliders for focus, stigma and so on as operating pictures, as described in FIG. 4, though these are omitted in this figure. Further, on the display 38 for the X-ray analyzer, there are displayed operating pictures, such as angle setting for the detector, measuring time setting, and selection of measuring elements.

Initially, the input control means 21 works so as to input the operating signal of the input means 18, 19 to the personal computer 16 for SEM control. As a result, a SEM image is displayed as shown in FIG. 9(A). At the time when control is transferred to the personal computer 39 for X-ray analysis, a button 41 for transferring of control is displayed on the operating screen picture of the display 15 for SEM control, and the mouse cursor 33 is moved on the button 41 to be clicked. Then, the control program switches the input control means 21 so that the operating signal of the input means is input to the personal computer 39 for X-ray analysis.

By doing so, the operating signal of the input means is input to the personal computer 39 for X-ray analysis so that X-ray analysis control becomes operable and a X-ray line analysis profile image is displayed as shown in FIG. 9(B). On the other hand, at the time when control is transferred to the personal computer 16 for SEM control, as shown in FIG. 9(C), a button 42 for transferring of control is displayed on the operating screen picture of the display 38 for X-ray analysis (See FIG. 9(D)), and the button 42 is clicked. Then the control program switches the input control means 21 so that the operating signal of the input means is input to the personal computer 39 for X-ray analysis.

The switching of the input control means 21 may be realized by using a dedicated switch. With such a construction, two personal computers can be operated using one set of input means, and consequently it is possible to reduce the installation area and improve the operability.

Although two personal computers 16, 39 are used in this embodiment, it may be possible that one personal computer performs control and input/output operation for both of the scanning electron microscope and the X-ray analyzer. Even in this case, from the standpoint of picture resolution, it is preferable that two displays for SEM control and for X-ray analysis are used. However, if there is enough area on a single display screen to display the image pictures for both the scanning electron microscope and the X-ray analyzer, a single display may be employed. In a case of using a single display, there is no need to provide the buttons 41 and 42 for transferring of control, and control of the scanning electron microscope and the X-ray analyzer can be performed merely by moving the mouse cursor 33 to a desired position on the operating image pictures.

In the described embodiments, the control signal converting means 30 is provided in the input control means, while it may be provided in the SEM control means.

As described above, according to the embodiments of the present invention, since the input control means distributes the operating signal to the computer, such as personal computer, and the control signal converting means, it is possible to provide a scanning electron microscope which has a high speed response time capable of attaining a pleasant operating environment, while using a window system to improve the efficiency of developing an application program for a computer.

Further, since the image composing means stores image data to be displayed on the screen of an output unit into a memory of the computer as soon as it receives the image data, it is possible to provide a scanning electron microscope which is capable of transmitting the image data in the image memory to the memory of the computer in a short time.

Furthermore, since the input control means distributes the operating signal of one set of the input means to a plurality of computers, it is possible to reduce the installation area and improve the operability.

Since it is obvious that many changes and modifications can be made in the above described details without departing from the nature and spirit of the invention, it is to be understood that the invention is not to be limited to the details described herein.

What is claimed is:

1. A scanning electron microscope, which comprises means for emitting an electron beam; means for focusing the electron beam on a sample; means for scanning the focused electron beam so as to produce an information signal characteristic of the sample; means for producing digital image data on the basis of the information signal; means for storing the digital image data; means for storing digital SEM operating picture data; a computer; means connected operatively to the computer for displaying an image of the sample, on the basis of the digital image data stored in the digital image data storing means with the SEM operating picture data storing means, on the image displaying means; means for producing and supplying an operating signal to the computer; means connected operatively to the operating signal producing means for producing a control signal in response to receipt of the operating signal without passing the operating signal through the computer; and means for changing a parameter associated with the image on the basis of the control signal.

2. A scanning electron microscope according to claim 1, wherein said parameter determines a quality of the image.

3. A scanning electron microscope according to claim 2, wherein the image quality determining parameter is at least one of a focal length of the electron focusing means, astigmatism of the electron beam, a deviation of an axis of the electron beam from a correct axis thereof, brightness of the image and contrast of the image.

4. A scanning electron microscope according to claim 1, wherein the computer produces an additional control signal in response to receipt of the operating signal and selectively applies the control signal and the additional control signal to the parameter changing means so that said parameter is changed on the basis of any one of the control signal and the additional control signal.

5. A scanning electron microscope according to claim 1, wherein the control signal producing means is included in one of the operating signal producing means and the parameter changing means.

6. A scanning electron microscope according to claim 1, which further comprises means for combining the digital image data and the digital SEM operating picture data so as to produce composite data.

7. A scanning electron microscope according to claim 1, wherein the operating signal producing means comprises an operating panel dedicated to the scanning electron microscope.

8. A scanning electron microscope according to claim 1, which further comprises an additional computer, the operating signal being also applied to the additional computer.

9. A scanning electron microscope according claim 6, wherein the computer comprises a memory in which the composite data are transmitted and stored.

* * * * *